United States Patent [19]
Frater

[11] Patent Number: 6,129,998
[45] Date of Patent: Oct. 10, 2000

[54] COPPER/STEEL LAMINATED SHEET FOR USE IN MANUFACTURING PRINTED CIRCUIT BOARDS

[75] Inventor: Mark S. Frater, Stockton, Calif.

[73] Assignee: R.E. Service Company, Inc., Lodi, Calif.

[21] Appl. No.: 09/058,262

[22] Filed: Apr. 10, 1998

[51] Int. Cl.⁷ .................................................. B32B 15/20
[52] U.S. Cl. .................. 428/677; 428/685; 428/626; 428/607; 428/201; 428/198
[58] Field of Search .................. 428/337, 336, 428/607, 685, 677, 626, 201, 198

[56] References Cited

U.S. PATENT DOCUMENTS

| | | |
|---|---|---|
| Re. 29,820 | 10/1978 | Konicek . |
| 2,688,348 | 9/1954 | Sullivan . |
| 2,706,165 | 4/1955 | Korsgaard . |
| 3,589,975 | 6/1971 | Andrews et al. . |
| 3,592,722 | 7/1971 | Morgan . |
| 3,647,592 | 3/1972 | Woodberry . |
| 3,730,825 | 5/1973 | Nakane . |
| 3,808,088 | 4/1974 | Knechtges et al. . |
| 3,932,250 | 1/1976 | Sato et al. . |
| 3,936,548 | 2/1976 | Konicek . |
| 3,948,701 | 4/1976 | Fasbender et al. . |

(List continued on next page.)

FOREIGN PATENT DOCUMENTS

| | | |
|---|---|---|
| 0 212 124 | 3/1987 | European Pat. Off. . |
| 0 235 582 | 9/1987 | European Pat. Off. . |
| 299 454 | 1/1989 | European Pat. Off. . |
| 0 411 142 | 2/1991 | European Pat. Off. . |
| 0 872 301 | 10/1998 | European Pat. Off. . |
| 28 43 263 | 2/1980 | Germany . |
| 31 31 688 | 5/1982 | Germany . |
| 41 16 543 | 11/1992 | Germany . |
| 297 19 716 U | 12/1997 | Germany . |
| 52-5353 | 2/1977 | Japan . |
| 62-208915 | 9/1987 | Japan . |
| 2-58885 | 2/1990 | Japan . |
| 2-291191 | 11/1990 | Japan . |
| 2-310041 | 12/1990 | Japan . |
| 4-186798 | 7/1992 | Japan . |
| 1 217 104 | 12/1970 | United Kingdom . |

OTHER PUBLICATIONS

Hinton, P., "The High–Yield Challenge in Laminating MLBs", Elelctronic Packaging and Production, vol. 30, No. 1, pp. 56–61, Jan. 1990.

Declaration of Alan Gishi, United States District Court, Northern District of California, San Jose Division, Case No. C92 20672 JW (PVT), Dec. 7, 1992.

Declaration of Robert Jordan, United States District Court, Northern District of California, San Jose Division, Case No. C92 20672 JW (PVT), Nov. 25, 1992.

Declaration of Glynn Shaw, United States District Court, Northern District of California, San Jose Division, Case No. C92 20672 JW (PVT), Nov. 30, 1992.

Memorandum to the Assistant Commissioner of Patents, Response to Petition for Public Use Proceeding Under 37 CFR 1.292, Ser. No. 07/955,121, United States Patent and Trademark Office, Dec. 8, 1994, pp. 3–4.

Pohl et al., "Producing and Jointly Processing Base Laminates for Multilayer Printed Circuit Cards", IBM Technical Disclosure Bulletin, vol. 27, No. 8, Jan. 1985, pp. 4841–4842.

*Primary Examiner*—Deborah Jones
*Assistant Examiner*—Wendy Boss
*Attorney, Agent, or Firm*—John P. O'Banion

[57] ABSTRACT

A sheet laminate for use in a press lay-up between printed circuit board panels having a steel alloy substrate layer and a copper foil layer disposed on at least one surface of the substrate layer. The foil layer is attached onto the surface of the substrate layer by a plurality of occurrences of adhesive material disposed along the boundary of the foil layer such that gaps are defined between occurrences of the adhesive material.

14 Claims, 1 Drawing Sheet

U.S. PATENT DOCUMENTS

| | | |
|---|---|---|
| 3,984,598 | 10/1976 | Sarazin et al. . |
| 3,990,926 | 11/1976 | Konicek . |
| 4,022,648 | 5/1977 | Woodberry et al. . |
| 4,023,998 | 5/1977 | Cederberg et al. . |
| 4,092,925 | 6/1978 | Fromson . |
| 4,113,576 | 9/1978 | Hutkin . |
| 4,179,324 | 12/1979 | Kirkpatrick . |
| 4,180,608 | 12/1979 | Del . |
| 4,351,873 | 9/1982 | Davis . |
| 4,357,395 | 11/1982 | Lifshin et al. . |
| 4,381,327 | 4/1983 | Briere . |
| 4,383,003 | 5/1983 | Lifshin et al. . |
| 4,394,419 | 7/1983 | Konicek . |
| 4,446,188 | 5/1984 | Patel et al. . |
| 4,455,181 | 6/1984 | Lifshin et al. . |
| 4,568,413 | 2/1986 | Toth et al. . |
| 4,587,152 | 5/1986 | Gleichenhagen et al. . |
| 4,715,116 | 12/1987 | Thorpe et al. . |
| 4,722,765 | 2/1988 | Ambros et al. . |
| 4,781,969 | 11/1988 | Kobayashi et al. . |
| 4,788,102 | 11/1988 | Koning et al. . |
| 4,847,146 | 7/1989 | Yeh et al. . |
| 4,872,934 | 10/1989 | Kameda . |
| 4,875,283 | 10/1989 | Johnston . |
| 4,961,806 | 10/1990 | Gerrie et al. . |
| 5,030,302 | 7/1991 | Jud et al. . |
| 5,057,372 | 10/1991 | Imfeld et al. . |
| 5,096,522 | 3/1992 | Kawachi et al. . |
| 5,120,590 | 6/1992 | Savage et al. . |
| 5,153,050 | 10/1992 | Johnston . |
| 5,350,621 | 9/1994 | Yuhas et al. . |
| 5,512,381 | 4/1996 | Konicek et al. . |
| 5,674,596 | 10/1997 | Johnston . |
| 5,716,168 | 2/1998 | Janoff . |
| 5,725,937 | 3/1998 | Johnston . |
| 5,951,803 | 9/1999 | Johnston . |

COPPER/STEEL LAMINATED SHEET FOR USE IN MANUFACTURING PRINTED CIRCUIT BOARDS

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention pertains generally to circuit board fabrication, and more particularly to a copper/metal laminated structure for use in the manufacture of printed circuit boards.

2. Description of the Background Art

In early stages of manufacturing technology, printed circuit board (PCB) lay-up panels were laminated using presses similar to those used in the wood industry for laminating, for example, sheets of plywood. Hydraulic-driven presses were used, and steam or electric power was used to heat the presses to temperatures exceeding 350° F. The panel components in the presses were submitted to pressures between 300 psi and 500 psi at 3500° F. for approximately one hour to achieve lamination. Highly polished and precision ground stainless steel plates approximately 0.060 inches thick were used to separate each panel within a press opening. Typically, a T-304 full hard alloy or equivalent material was used for these plates. A problem, however, was that these stainless steel separator plates required cleaning or scrubbing to remove debris after every use and periodically needed to be resurfaced to remove dents and scratches due to handling and use. Eventually, the plates had to be replaced.

During the late 1980's, the introduction of vacuum assisted presses permitted the use of lower pressures during the lamination cycle. The pressures used in vacuum assisted presses typically ranged from approximately 150 psi to 250 psi, as opposed to the 300 psi to 500 psi range used in the hydraulic steam driven or electric presses. With vacuum assisted presses, aluminum separator sheets ranging in thickness from 0.007 to 0.015 inches were tested and then used extensively. Test results published during that time indicated that thin aluminum separator plates far exceeded the performance of steel plates for laminating PCB panels. These thin aluminum separator sheets were discarded after the lamination process, thus eliminating the need for expensive steel plate cleaning and handling operations and the frequent and high capital investment needed to replace the steel plates. The alloy used for aluminum separator plates is typically 3000 series (e.g. 3003, 3004, 3105 or equivalent) with a H19 hardness designation, which is identical to the alloy used to make aluminum beverage cans. The process using thin aluminum separator sheets along with low pressure from vacuum assisted presses has worked well for typical 4 layer to 6 layer PCB's with circuit lines of approximately 0.008 inches in width and approximately 0.008 inches apart. A typical configuration in a press opening would be a steel plate on top and bottom of the stack with thin aluminum sheets separating each PCB panel. The rate of production in these vacuum assisted presses increased to about 10–14 PCB panels per typical 1½ inch press opening from the 6 to 8 PCB panels achieved using stainless steel sheets.

Technological advancements, however, have driven a need for PCBs having more and denser circuitry. This means that circuits must have finer lines (less than 0.006 inches wide) and closer spacing between circuit lines (less than 0.006 inches). Denser surfaces on a PCB permit a higher quantity of electrical components to be mounted thereon, thus enabling faster information processing and greater miniaturization of electronic hardware. These greater technological demands have made the surface quality of the laminated circuit board panels even more critical. Problems such as surface roughness and image transfer that also previously existed, have now become critical issues that require resolution, as any minute bump on the surface of the aluminum sheet will be transferred to the top surface of the board necessitating scraping the board and reworking the PCB fabrication process.

To prevent and minimize scrap and rework due to image transfer and surface quality problems, almost every press configuration used today employs stainless steel plates (usually T-304 or T-600 stainless steel) placed adjacent to the thin aluminum separator sheets in addition to on the top and bottom of the stack. Many press loads have at least three steel plates added to the lay-up, which then reduces the number of panels that can be laminated in each press cycle. Some of the lay-up configurations have both aluminum sheets and steel plates separating every panel in the press, with the aluminum separator sheets being discarded after the press cycle. This approach, however, has not completely cured the problem as it causes a decrease in the production rate of the press. Also, pits, dents and other surface imperfections due to the re-introduction of steel plates into the process are still causing scrap and rework of PCB panels. Moreover, many PCB fabricators have to purchase additional new stainless steel plates and again install expensive plate cleaning and handling systems. Although the thin aluminum separator sheets are discarded after every press cycle, the steel plates must be cleaned before each use, adding additional operational steps and cost to the PCB fabrication process. To maintain production demands, fabricators must purchase additional vacuum presses, at a cost of approximately $250,000 to $1,000,000 per unit, to compensate for the loss of productivity due to the re-introduction of steel plates into the PCB fabrication process.

Today, fabricators are producing between 3 and 8 PCB panels on high technology dense boards with more quality problems and at a high cost. Dense state of the art PCB's now require 2 separators, a steel plate and a thin sheet of aluminum. This is an expensive step backward to the beginning of the evolution of the PCB fabrication process. Accordingly, there is a need for a separator that allows PCB production to be maximized, eliminates the surface quality and image transfer problems associated with aluminum separator sheets and eliminates the constant cleaning and scrubbing required of stainless steel separator plates. The present invention satisfies those needs, as well as others, and generally overcomes the deficiencies found in the background art.

BRIEF SUMMARY OF THE INVENTION

The deficiencies inherent in conventional PCB laminates and lamination processes are overcome by the present invention which generally comprises a laminate structure for use in a PCB press lay-up that is fabricated from a sheet of corrosion resistant metal and a sheet of copper. By way of example, and not of limitation, the invention preferably comprises a metal substrate having a corrosive resistant coating, onto which a copper foil layer is attached by an adhesive material. The copper foil layer is attached to either one or both sides of the metal substrate. When heated and compressed onto the PCB panel, the copper adheres to and becomes a functional element of the final PCB, while the metal substrate is removed and discarded. Use of the metal sheet eliminates and/or reduces the need for steel plates in the press lay-up. As a result, the surface quality of the PCB is improved, image transfer is reduced and a flatter, less wavy PCB is produced. The similarity in the coefficients of thermal expansion (CTE) between steel and copper allows the PCB's produced to be flatter, thus providing for a better registration of the foil layer to the substrate layer of the sheet laminate. Additional information regarding sheet laminate technology and processes for manufacturing PCB's can be found in U.S. Pat. Nos. 4,875,283; 5,120,590; 5,512,381 and 5,153,050; all of which are incorporated by reference herein.

An object of the invention is to provide a sheet laminate, for use in a press lay-up between PCB layers, that eliminates the need for aluminum separator sheets and their associated problems.

Another object of the invention is to provide a sheet laminate, for use in a press lay-up between PCB layers, that eliminates the need for steel plates and their associated problems.

Another object of the invention is to provide a sheet laminate, for use in a press lay-up between PCB layers, that reduces and/or eliminates image transfer from the substrate layer onto the foil layer.

Another object of the invention is to provide a sheet laminate, for use in a press lay-up between PCB layers, that results in flatter, less wavy PCB panels.

Another object of the invention is to provide a sheet laminate for use in a press lay-up between PCB layers that has a CTE less than or equal to the CTE of copper.

Still another object of the invention is to provide a sheet laminate, for use in a press lay-up between PCB layers, that maximizes the number of PCB panels that can be produced for a given press opening.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWING

The invention will be more fully understood by reference to the following drawings which are for illustrative purposes only.

DETAILED DESCRIPTION OF THE INVENTION

Figure 1:
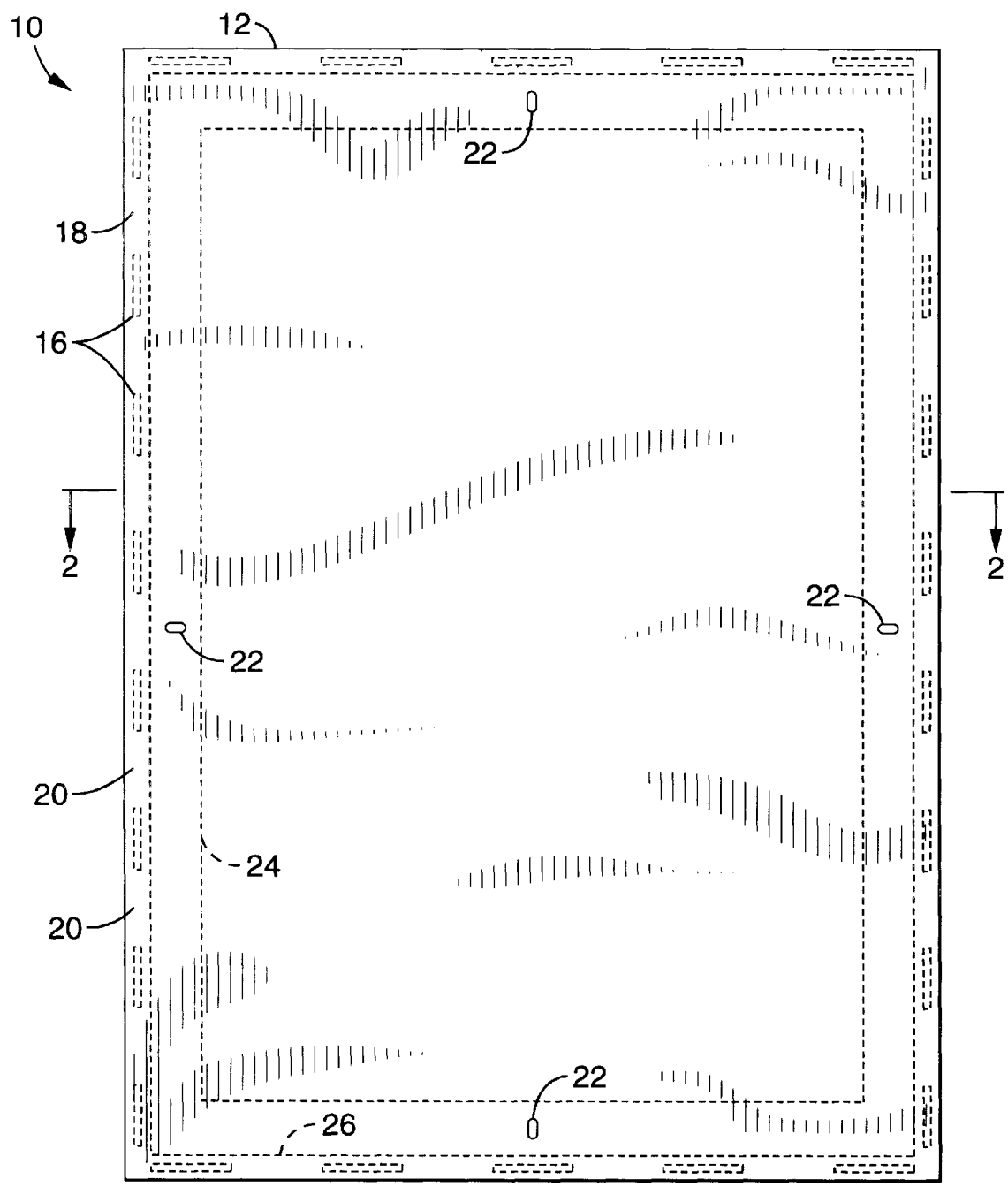
FIG. 1 is a schematic plan view of a laminate sheet in accordance with the present invention.
Figure 2:
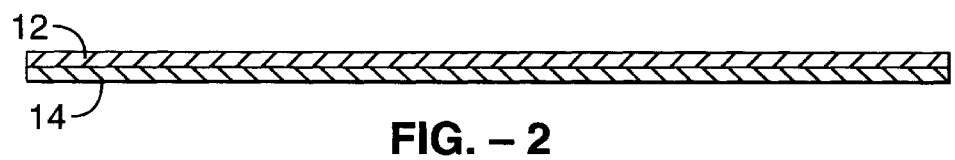
FIG. 2 is a cross-section of the laminate sheet shown in FIG. 1 taken through line 2—2.

Referring more specifically to the drawing, for illustrative purposes the present invention is embodied in the apparatus generally shown in FIG. 1 and FIG. 2. It will be appreciated that the apparatus may vary as to configuration and as to details of the parts without departing from the basic concepts as disclosed herein.

In FIG. 1 and FIG. 2, a sheet laminate apparatus 10 for PCB manufacturing in accordance with the preferred embodiment of the present invention is generally shown. Apparatus 10 comprises a metal substrate 12 with a copper foil layer 14 affixed to substrate 12 by adhesive material 16. Copper foil layer 14 can be present on either or both sides of substrate 12. Use of steel alloy substrate 12 in accordance with the present invention has been found to be superior to the commonly used 0.010 inch to 0.015 inch 3004 aluminum substrate in reducing image transfer and improving surface quality of the PCB, while also significantly improving productivity of PCB panels. Sheet laminate apparatus 10 of the present invention is designed for use in both traditional low pressure vacuum presses that operate in the range between approximately 150 psi and 250 psi, as well as high pressure presses up to 500 psi, which is well beyond the capability of aluminum.

Two types and thicknesses of metal in particular were determined ideal for use as substrate material, namely, nickel or zinc-nickel plated 1008 low carbon steel. The thickness of metal substrate 12 can range from approximately 0.002 inches and 0.025 inches, although the preferable thickness is between approximately 0.005 inches and 0.015 inches. Copper foil layer 14 preferably has a thickness ranging from approximately 0.00025 inches to approximately 0.005 inches.

Greater productivity is accomplished through use of steel alloy substrates which are approximately 0.008 inches thick, which represents the preferred embodiment The use of approximately 0.008 inch metal substrates eliminates the need or reduces the number of steel plates required in a press lay-up, resulting in a greater number of PCB panels being placed into the press for a given lamination process. The "kiss cycle" during the lamination process, which is a prerequisite for the successful use of aluminum substrates, can also eliminated as a result of sheet laminate apparatus 10, thereby reducing the overall production time. The function of the "kiss cycle" is to soften or melt the epoxy before full pressure is applied. Fully liquefied epoxy flows away from the high pressure area into regions between circuits to minimize print through.

For illustrative purposes, the metallurgical and other characteristics of the preferred steel alloy used in the present invention are compared with aluminum in the table that follows:

| Composition | 1008 CS STEEL Iron and carbon | 3004 H-19 ALUMINUM Aluminum with traces of magnesium and manganese. |
| --- | --- | --- |
| Hardness (Rockwell B) | 80–100 | 3–10 |
| Density ($^{lb}/_{in^3}$) | 0.290 | 0.098 |
| CTE (inCheSAF) | 7.2 | 13.9 |
| Yield Strength (ib/##2) | 133,000 | 41,000 |
| Tensile Strength (Ib/m2) | 140,000 | 43,000 |
| Modulus of Elasticity ($^{lb}/_{in^2}$) | 28,000,000 | 10,200,000 |
| Roughness (RMS) | <12 | 18–25 |

Note also that the surface of the PCB laminate that is produced is only as smooth as the material that is pressed against it. The surface quality of the PCB laminated with metal substrates is improved significantly by employing a metal having a surface finish of no greater than 12 RMS. In comparison, aluminum has a surface finish around 18 RMS to 22 RMS. The issue of surface finish is critical especially when miniaturization is an objective, because the fewer imperfections that exist on the surface of the PCB when dense electrical paths are etched thereon, the more reliable the final PCB product. Steel alloy substrate 12 employed in the present invention has a low propensity to scratch, pit or dent because it is many times harder than other metals, such as aluminum. Therefore, a PCB laminated with steel alloy substrates will have less likelihood of surface imperfections.

Another the advantage provided by the steel alloy used in sheet laminate apparatus 10 is the additional hardness steel offers, along with greater rigidity, which significantly reduces image transfer onto foil layer 14 and ultimately, onto the finished PCB. Substrate 12 typically has a Rockwell B hardness rating between approximately 80 to 100, with a preferred hardness rating of 95. A PCB laminated with such a steel alloy substrate is also less wavy as compared to a PCB laminated with an aluminum substrate.

Preferably substrate 12 is plated with nickel or nickel-zinc to provide corrosion resistance, although other common resistant coats, including polymers or electrolized aluminum (chrome), could be used. Lead, however, would not be a appropriate material since it is very soft and will bond to the copper foil layer during when heated. An additional surprising characteristic results from nickel plating steel alloy substrate 12, namely, the hardness of substrate 12 increases as it gets hotter. For example, the hardness of the nickel plated steel substrate increases by approximately 20% as the substrate is heated to the curing temperature of 350° F. The optimum thickness of the nickel plating is typically between approximately $20\mu$ inches and $50\mu$ inches.

The greater rigidity provided by steel alloy substrate 12 used in the present invention also provides better support for copper foil layer 14 and practically eliminates the bellows-effect associated with aluminum substrates. Because of low rigidity, an aluminum substrate flexes easily and, when flexed, the aluminum substrate momentarily separates from the copper foil layer thereby creating a suction that draws dust and debris into the resultant gaps. As a result of dust and debris entering the gaps, dent and epoxy spots appear on the finished PCB surface. A complete seal between steel alloy substrate 12 and foil layer 14, essential for aluminum substrates, is therefore unnecessary for steel alloy substrates.

Significantly, the atomic crystal lattice patterns for aluminum and nickel plated steel are very different. The atoms in aluminum are arranged in a face centered cubic (FCC) pattern. The atoms in steel, however, are arranged in a body centered cubic (BCC) pattern. The nickel plating on the steel substrate is amorphous with no definite microstructure. This material is not a wrought product and is created by an electrical plating process. These crystal lattice patterns significantly influence the physical and mechanical properties of each material and explain why they present different characteristics in the same heated environment.

The heat transfer characteristics of steel alloy provide a consistent and uniform heat rise with little variability. It is this uniformity in heat rise that reduces PCB panel thickness variations and provides a more consistent lamination quality with the present invention. The steel alloy must have a CTE less than that of copper (e.g. less than approximately 9.8 $\mu$inches/° F.), thereby allowing the copper foil layer to proportionally register with the steel alloy substrate layer. During the thermal expansion process, copper foil layer 14 moves more than substrate 12, so a substrate material having a CTE equal to or less than copper would optimize registration between the two substances. Substrate 12 preferably has a coefficient of thermal expansion ranging between approximately 6.5 $\mu$inches/° F. and 7.5 $\mu$inches/° F. Copper expands to approximately 50% as compared to expansion of aluminum while steel alloy expands to approximately 90% as compared to aluminum. In direct comparison, the CTE of aluminum is 84% greater than that of steel. This means that a 24-inch wide unrestrained sheet of aluminum heated from room temperature (70° F.) to curing temperature will have its width increased by approximately 0.090 inches. A steel sheet of identical proportion will have a width increase of approximately 0.049 inches and copper will have a width increase of 0.066 inches. It can be clearly seen that not only are the dimensional differences between copper and steel less than the dimensional difference between aluminum and copper, the steel alloy expands overall less than the copper which has been determined to be preferable. As a result, the PCB's produced using steel alloy substrates are flatter and more uniform as compared with those produced using aluminum substrates.

The primary material for PCB panels is woven fiberglass which is pre-pregnated (pre-preg) with a viscous thermosetting resin. Copper from the foil layer in the sheet laminate is transferred onto each face of the pre-preg in the press during lamination. During lamination, the woven fiberglass and resin pre-preg are heated and become a viscous liquid, free to expand along with the metals in the stack. Therefore, no significant stresses are induced into these composite materials by thermal expansion during heat up for curing. Since copper foil layer 14 is very thin compared to substrate 12, frictional forces will restrain foil layer's 14 movement during heating. The copper will therefore, yield as the substrate material expands. If the substrate material is aluminum, the copper foil layer will be stretched 0.024 inches over the width of a twenty-four inch circuit board is heated to the curing temperature, and uneven localized loading will cause the foil layer to be stretched non-uniformly, more in some areas than others, resulting in a "rippling" or "wavy" effect in the copper foil layer. Alternatively, if the substrate material is steel alloy, as in sheet laminate apparatus 12, foil layer 14 will not be stretched during heating to the curing temperature, and thus no uneven loading will occur on foil layer 14 and also blister causing strains in foil layer 14 is reduced.

The adhesive material 16 that is used to adhere copper foil layer 14 to steel alloy substrate 12 preferably comprises a rubber compound, as rubber compound adhesives offer more durability in handling prior to its use. Adhesive material 16 is placed around the perimeter of the sheets and within a margin 18 that is typically between approximately 0.25 inches and 1 inch wide, depending on end product and customer requirements. Adhesive material 16 is arranged generally linearly in a plurality of occurrences such that gaps or openings 20 are defined between occurrences of adhesive material 16. The width of adhesive material 16 in each occurrence typically varies between approximately 0.002 inches and approximately 0.100 inches, but is typically between approximately 0.060 inches and approximately 0.090 inches, and the height or thickness is typically between approximately 0.001 inches and approximately 0.003 inches. Each occurrence of adhesive material 16 can take the form of strips or dots, as long a continuous line of adhesive material is not employed. The occurrences of adhesive material 16 make up between approximately 40% to 60% of the perimeter length, thus leaving gaps 20 formed along 40% to 60% of the perimeter. A continuous line of adhesive material previously necessary between the copper foil layer and aluminum substrates to seal the region between the copper foil layer and the aluminum substrate from dust and debris is no longer a requirement with steel alloy substrates, due to the elimination of the bellows effect in the sheet laminate. Apertures 22 along each edge of apparatus 10 represent typical tooling positions. Apertures 22 are typically disposed between the outer edges of apparatus 10 and the finished circuit area 24. The finished panel edge 26 is formed after flash trimming by the customer.

Accordingly, it will be seen that this invention provides a sheet laminate having a metal substrate layer and a copper foil layer that is placed in a press lay-up for lamination to produce PCB panels with surfaces virtually free of image transfer and surface quality problems, while simultaneously improving productivity in the PCB manufacturing process. Although the description above contains many specificities, these should not be construed as limiting the scope of the invention but as merely providing illustrations of some of the presently preferred embodiments of this invention. Thus the scope of this invention should be determined by the appended claims and their legal equivalents.

What is claimed is:

1. A sheet laminate for use in manufacturing printed circuit boards, comprising:
   (a) a metal substrate layer which has a coefficient of thermal expansion less than approximately 9.8 $\mu$inches per ° F., said substrate layer having a Rockwell B hardness between approximately 80 and approximately 100;
   (b) at least one foil layer of copper disposed over a surface of said substrate layer; and
   (c) a plurality of occurrences of adhesive material disposed between said substrate layer and said foil layer, said occurrences adhesive material arranged generally linearly along the periphery of said foil layer such that gaps are defined between said occurrences of adhesive material.

2. A sheet laminate as recited in claim 1, wherein said substrate layer has a thickness between approximately 0.002 and 0.025 inches.

3. A sheet laminate as recited in claim 1, wherein said substrate layer has a surface finish of less than 12 RMS.

4. A sheet laminate as recited in claim 1, wherein said foil layer has a thickness between approximately 0.00025 and 0.005 inches.

5. A sheet laminate as recited in claim 1, wherein said occurrences of adhesive material make up between approximately 40% to 60% of the combined length of adhesive material and said gaps formed between said occurrences of adhesive material.

6. A sheet laminate for use in manufacturing printed circuit boards, comprising:
   (a) a metal substrate layer which has a coefficient of thermal expansion less than approximately 9.8 $\mu$inches per ° F., said substrate layer having a surface finish of less than 12 RMS;
   (b) at least one foil layer of copper disposed over a surface of said substrate layer; and
   (c) a plurality of occurrences of adhesive material disposed between said substrate layer and said foil layer, said occurrences adhesive material arranged generally linearly along the periphery of said foil layer such that gaps are defined between said occurrences of adhesive material.

7. A sheet laminate as recited in claim 6, wherein said substrate layer has a thickness between approximately 0.002 and 0.025 inches.

8. A sheet laminate as recited in claim 6, wherein said foil layer has a thickness between approximately 0.00025 and 0.005 inches.

9. A sheet laminate as recited in claim 6, wherein said substrate layer has a Rockwell B hardness between approximately 80 to 100.

10. A sheet laminate as recited in claim 6, wherein said occurrences of adhesive material make up between approximately 40% to 60% of the combined length of adhesive material and said gaps formed between said occurrences of adhesive material.

11. A sheet laminate for use in manufacturing printed circuit boards, comprising:
    (a) a metal substrate layer which has a coefficient of thermal expansion less than approximately 9.8 $\mu$inches per ° F., said substrate layer having a Rockwell B hardness between approximately 80 to 100, said substrate layer having a surface finish of less than 12 RMS;
    (b) at least one copper foil layer, said foil layer disposed over a surface of said substrate layer; and
    (c) a plurality of occurrences of adhesive material disposed between said substrate layer and said foil layer, said occurrences adhesive material arranged generally linearly along the periphery of said foil layer such that gaps are defined between said occurrences of adhesive material.

12. A sheet laminate as recited in claim 11, wherein said substrate layer has a thickness between approximately 0.002 and 0.025 inches.

13. A sheet laminate as recited in claim 11, wherein said foil layer has a thickness between approximately 0.00025 and 0.005 inches.

14. A sheet laminate as recited in claim 11, wherein said occurrences of adhesive material make up between approximately 40% to 60% of the combined length of adhesive material and said gaps formed between said occurrences of adhesive material.

* * * * *